(12) United States Patent
Yamaguchi

(10) Patent No.: US 6,319,830 B1
(45) Date of Patent: Nov. 20, 2001

(54) PROCESS OF FABRICATING SEMICONDUCTOR DEVICE

(75) Inventor: Shinji Yamaguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/498,656

(22) Filed: Feb. 7, 2000

(30) Foreign Application Priority Data

Feb. 16, 1999 (JP) .................................................. 11-036776

(51) Int. Cl.[7] .................................................... H01L 21/44
(52) U.S. Cl. ........................................... 438/678; 438/688
(58) Field of Search ...................................... 438/678, 688

(56) References Cited

U.S. PATENT DOCUMENTS 6,093,453 * 7/2000 Ang ...................................... 427/438

OTHER PUBLICATIONS

Unexamined Japanese Patent Publication No. Hei 9(1997)–306871.

Unexamined Japanese Patent Publication No. Hei 9(1997)–326395.

\* cited by examiner

*Primary Examiner*—Charles Bowers
*Assistant Examiner*—Thanh Nguyen
(74) *Attorney, Agent, or Firm*—Nixon & Vanderhye P.C.

(57) ABSTRACT

A process of fabricating a semiconductor device which has a wiring layer and active elements on a semiconductor substrate, the wiring layer and the active elements being protected by a protective film, and is provided with a projected electrode for connection with a outside in an opening portion of the protective film on an Al electrode pad electrically connected to the wiring layer, which comprises the steps of: removing by sputtering a surface oxide film formed on a surface of the Al electrode pad; depositing a film of a first metal on the Al electrode pad by substituting the first metal with Al constituting the Al electrode pad; and depositing a film of a second metal for constituting the projected electrode on the film of the first metal by substituting the first metal with the second metal, and forming the projected electrode by electroless plating by use of autocatalytic reaction.

8 Claims, 4 Drawing Sheets

PROCESS OF FABRICATING SEMICONDUCTOR DEVICE

CROSS-REFERENCE TO RELATED APPLICATION

This application is related to Japanese application No. HEI 11(1999)-36776 filed on Feb. 16, 1999, whose priority is claimed under 35 USC §119, the disclosure of which is incorporated by reference in its entirety.

BACKGROUND OF THE INVENTION

1. Field of the Invention

The present invention relates to a process of fabricating a semiconductor device and, more particularly, to a process of forming a projected electrode on an Al electrode pad for the connection of the Al electrode to the outside.

2. Description of Related Art

As one of the presently used methods for forming a projected electrode for the connection of an Al electrode pad to the outside, the electroless plating method is pointed out. In case of the electroless plating method, the sputtering step, the photolithography step and the etching step can be omitted, as compared with the electro-plating method, and therefore, the manufacturing costs can be reduced, which attracts attention.

However, in case a surface oxide film exists on the Al electrode pad, it becomes difficult to form a projected electrode with a desired shape. Due to this, the reliability in the connection of the projected electrode lowers. Thus, in case of performing electroless plating, it is important to remove the surface oxide film on the Al electrode pad which is a treatment performed before the plating. If the pre-treatment (a treatment performed with a solution containing Zn) for the electroless plating is performed in the state in which the surface oxide film remains on the Al electrode pad, then the substitute between Al and Zn cannot be performed with uniformity and denseness. Due to this, the core of the Ni or Ni alloy which constitutes the projected electrode and substitutes with Zn when the electroless plating is performed, is coarsely deposited. The Ni or Ni alloy which is coarsely deposited is also low in bond strength. Further, due to coarse deposition, there arises problems such as the problem that corrosion is caused due to the impurities penetrated from the outside, which lowers the reliability.

In connection with such problems, in Japanese Unexamined Patent Publication No. HEI 9(1997)-326395, the method according to which the surface oxide film is dissolved by the use of a solution such as sodium hydroxide, phosphoric acid or the like is pointed out as an example of the removal of the surface oxide film on an Al electrode pad.

Further, in Japanese Unexamined Patent Publication No. HEI 9(1997)-306871, there is disclosed the method according to which the surface oxide film on an Al electrode pad is removed by sputtering, and Ni-plating is carried out directly in an inert atmosphere.

FIGS. 4(a) to (d) are sectional views of the structure at respective fabricating steps in case the surface oxide film on the Al electrode pad is removed, using the solution disclosed in Japanese Unexamined Patent Publication No. HEI 9(1997)326395, and then, a projected electrode is formed. So far, this method has been used, but there is the problem that a dispersion is caused in the etched amount of the Al electrode pad, depending on the useful life and the frequency in use of the solution (etchant). In this case, there also arises the problem that a dispersion is caused in the etched amount due to the difference in etching rates on the Al electrode pad formed by sputtering. Due to these problems, a surface oxide film 23 is left locally on an Al electrode pad 22 as shown in FIG. 4(b). As a result, the substituting reaction between Al and Zn, in the pre-treatment, for depositing an electroless Ni or Ni alloy plating comes not to be performed with uniformity and denseness, as shown in FIG. 4(c). Accordingly, a dispersion takes place in the deposition of a Zn film 25.

Next, an electroless Ni or Ni alloy plating treatment is carried out. This plating treatment comprises the fact that Ni or Ni alloy which becomes nuclei is formed by the substituting reaction thereof with Zn, and then, Ni or Ni alloy is self-deposited with the nucleating Ni or Ni alloy as nuclei. However, since the deposition of the Zn film 25 disperses, the deposition of the nucleating Ni or Ni alloy also become coarse, producing a dispersion. Thus, a projected electrode 26 of Ni or Ni alloy which has projections and depressions on its surface is formed as shown in FIG. 4(d). Further, due to the self-deposition of the Ni or Ni alloy, the projected electrode is increased in its film thickness, but, since the nucleating Ni or Ni alloy is coarse, its grain size also becomes large, so that gaps are produced among the grain boundaries. Due to the existence of these gaps, corrosion is caused by the plating solution or impurities penetrate in at the subsequent plating step, thus lowering the reliability.

Further, since the Ni or Ni alloy portion becoming a core is coarse, the adhesion between the Al electrode pad and the projected electrode is also weak. FIG. 4(a) indicates the state in which the surface oxide film exists on the Al electrode pad.

Further, as disclosed in Japanese Unexamined Patent Publication No. HEI 9(1997)-306871, in case an Ni plating is directly made onto the Al electrode pad to form the projected electrode after the surface oxide film on the Al electrode pad is removed by sputtering, it is necessary to perfectly prevent the re-formation of a surface oxide film on the Al electrode pad. For this purpose, after the surface oxide film on the Al electrode pad is removed by sputtering, the sample must be moved directly into an inert atmosphere to continuously perform a plating step. This means that the provision of a large-scale apparatus becomes necessary.

SUMMARY OF THE INVENTION

According to the present invention, there is provided a process of fabricating a semiconductor device which has a wiring layer and active elements on a semiconductor substrate, the wiring layer and the active elements being protected by a protective film, and is provided with a projected electrode for connection with the outside in an opening portion of the protective film on an Al electrode pad electrically connected to the wiring layer, which comprises the steps of:

removing by sputtering a surface oxide film formed on a surface of the Al electrode pad;

depositing a film of a first metal on the Al electrode pad by substituting the first metal with Al constituting the Al electrode pad; and depositing a film of a second metal for constituting the projected electrode on the film of the first metal by substituting the first metal with the second metal, and forming the projected electrode by electroless plating by use of autocatalytic reaction.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

As for the semiconductor substrate which can be used in the present invention, no particular limitation is made; a substrate composed of a known material such as silicon is pointed out as usable. Further, as the protective film, on which no particular limitation is made, a film composed of a known material such as SiN is pointed out as usable. On the semiconductor substrate, there is formed a wiring layer which is electrically connected to active elements such as transistors and an Al electrode pad. In this connection, the protective film, the active elements, the Al electrode pad and the wiring layer can be formed by methods known in the art.

The present invention will now be described in detail, referring to FIGS. 1(a) to (d), FIGS. 2(a) and (b), and FIG. 3(a) and (b).

Figure 1A:
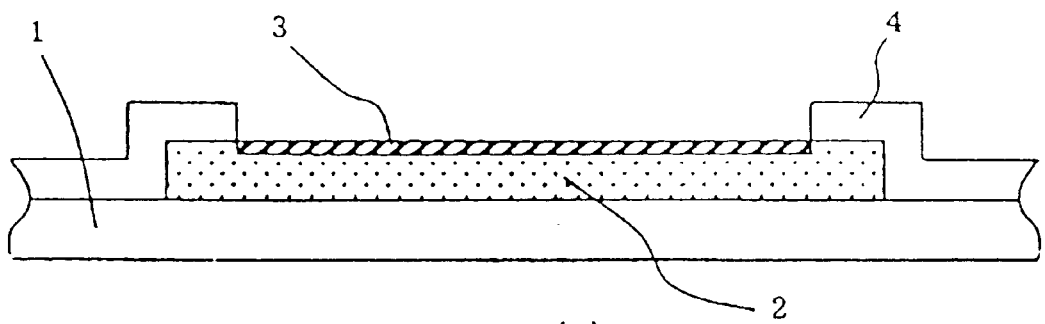
FIGS. 1(a) to 1(d) are schematic sectional views illustrating the step of forming a projected electrode in the process of a fabricating semiconductor device in accordance with the present invention.

FIG. 1(a) shows the state in which, on a semiconductor substrate 1, there is provided an Al electrode pad 2 covered with a protective film 4. Further, the protective film 4 has an opening portion in its region for forming a projected electrode; in the opening portion, the Al electrode pad 2 is exposed. On the Al electrode pad 2 in the opening portion, there exists a surface oxide film 3 which has been formed by the heat treatment step performed after the formation of the pad. The surface oxide film 3 is composed mainly of aluminum oxide.

Figure 1B:
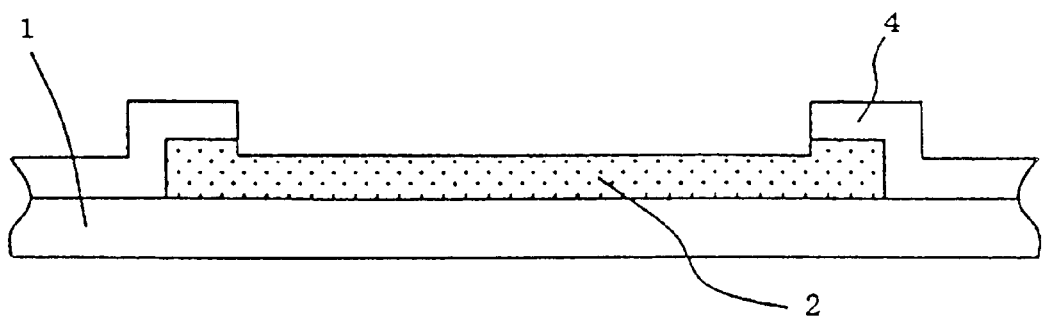

FIG. 1(b) shows the state in which the surface oxide film 3 on the Al electrode pad 2 is removed by sputtering. This sputtering should desirably be carried out under the condition that the output is 500 W to 1000 W, and the treating time is 5 to 30 (for example, 5 minutes). Further, as the discharging gas, an inert gas such as Ar can be used. Further, if the sputtering is carried out in a high vacuum, then the impurities in the vacuum chamber are decreased, and thus, the surface oxide film on the Al electrode pad can be removed more uniformly. As a result, a film of a first metal which will be formed later can be deposited with a more uniform and dense particle diameter. In case the sputtering output is less than 500 W, the removal of the oxide film become imperfect, so that it becomes difficult to obtain a projected electrode with a good surface shape and thus not desirable. Further, if the output exceeds 1000 W, then there arises the possibility that the active elements on the semiconductor substrate may be destroyed, which is not desirable.

Figure 1C:
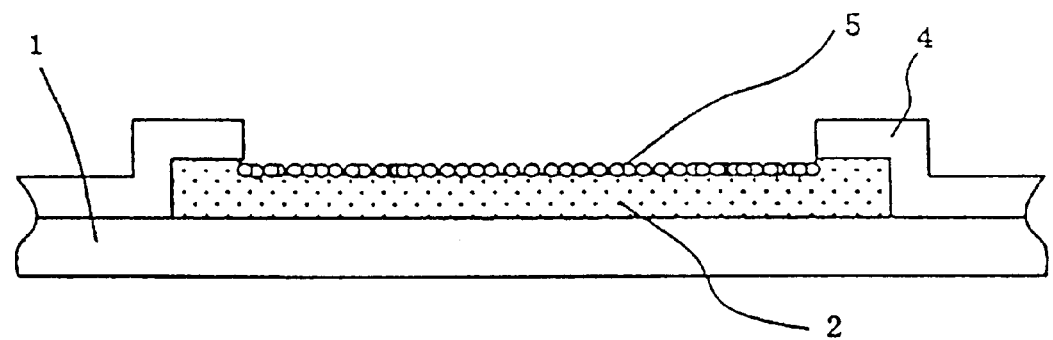

FIG. 1(c) is a sectional view of the state in which a film of a first metal 5 is formed on the surface of the Al electrode pad 2. Since the surface oxide film 3 on the Al electrode pad 2 is already removed by sputtering, the substituting reaction between Al and the first metal is uniformly effected, in the air, on the Al electrode pad 2. According to the present invention, the film of the first metal can be densely deposited with a particle diameter of $\frac{1}{10}$ or less, as compared with the case where the surface oxide film on the Al electrode pad 2 is removed by etching with the known solution.

Next, the film of the first metal is formed on the Al electrode pad by substituting reaction with Al constituting the Al electrode pad. As the film of the first metal, for example a Zn film is pointed out as usable.

As the method of forming the film of the first metal, there is pointed out the method according to which the Al constituting the Al electrode pad is substituted with a first metal. This method corresponds to the pre-treatment in the electroless plating method. The step of forming the film of the first metal in case the first metal is Zn.

The film of the first metal is obtained by dipping the Al electrode pad in an alkaline solution containing Zn at 25° C. for about 30 seconds. The film of the first metal thus obtained comprises a Zn film with a thickness of 300 to 500 Å. By repeating this dipping, the Zn film is formed more uniform and dense. However, the Al electrode pad suffers a film reduction when dipped, so that, if the dipping is excessively repeated, then the Al electrode pad will be gone. As a result, the adhesion acting between the Zn film and the semiconductor substrate is lost. Accordingly, the dipping should desirably be performed about once or twice.

In case the projected electrode is formed, by the plating method, directly on the Al electrode pad 2 of which the surface oxide film has been removed by sputtering as according to the known technique, the sample must be moved from within the vacuum chamber in the sputtering system directly into an inert atmosphere. This is for preventing the formation of a surface oxide film which adversely affects the formation of the projected electrode in the air. However, as according to the present invention, even if the sample is left to stand in the air for about 10 days after the surface oxide film 3 on the Al electrode pad 2 is removed by sputtering, the film of the first metal 5 is formed with uniformity and denseness. Therefore, surface oxide film that is formed in the air has not caused a problem.

Figure 1D:
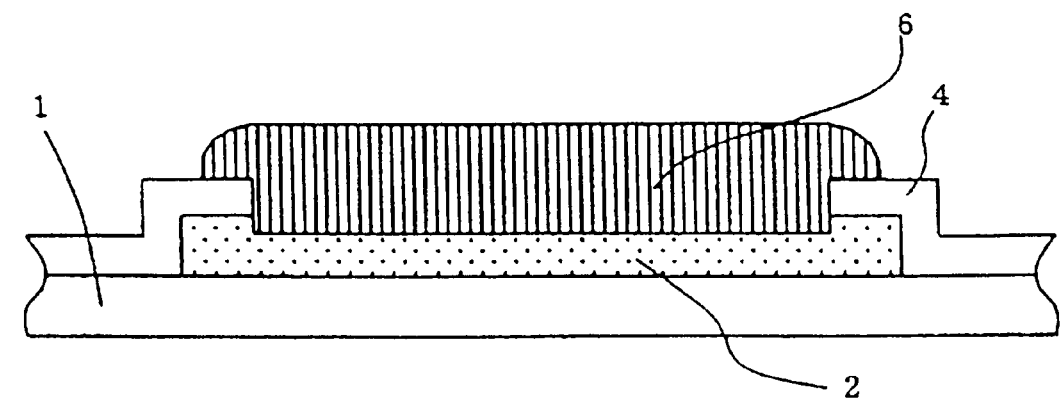

FIG. 1(d) shows the state in which, on the Al electrode pad 2, a projected electrode 6 comprising a film of a second metal is formed by the electroless plating method.

Here, the film of the second metal should desirably be composed of Ni or Ni alloy. The projected electrode 6 which is composed of Ni or Ni alloy should desirably be formed by dipping the sample in a solution containing Ni or both of a metal which forms an alloy with Ni and Ni at 30 to 95° C. for 2 to 200 minutes (preferably, at about 90° C. and for about 20 minutes). Since the film of the first metal is formed with uniformity and denseness, the projected electrode thus formed also becomes uniform and dense. Due to this, the surface of the projected electrode assumes a gap-less and smooth shape.

The height of the projected electrode 6 is preferably about 0.5 μm or greater by taking into consideration the securing of the space for the semiconductor substrate and the conductor lead when the semiconductor device is connected to the conductor lead projecting into the device hole and the space for another substrate and the semiconductor substrate.

Next, an example of the mounting of the semiconductor device with the projected electrode will be described below.

Figure 2A:
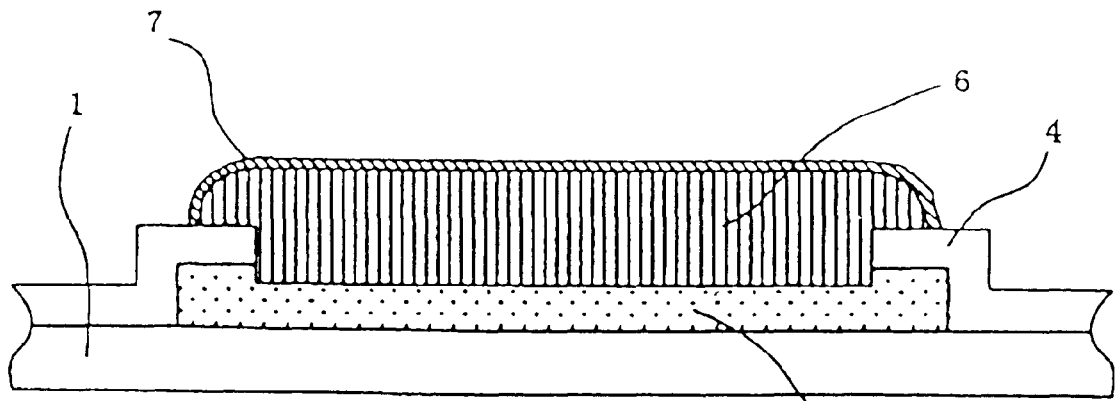
FIGS. 2(a) and 2(b) are schematic sectional views of a semiconductor device in a state where an Au film is formed on the top surface of the projected electrode shown in FIG. 1(d) and in a state where the Au film is electrically connected to a conductor pattern by use of an anisotropic conductive film, respectively.

FIG. 2(a) is a diagram showing the state in which an Au film is formed on the surface of the projected electrode 6 by the flash plating method. In this case, the Au film thus obtained is formed to a thickness of about 0.05 μm. This Au film can prevent the projected electrode from being oxidized, and the formation of this Au film is executed as a pre-treatment for the formation of an Au layer by an electroless plating step.

Figure 2B:
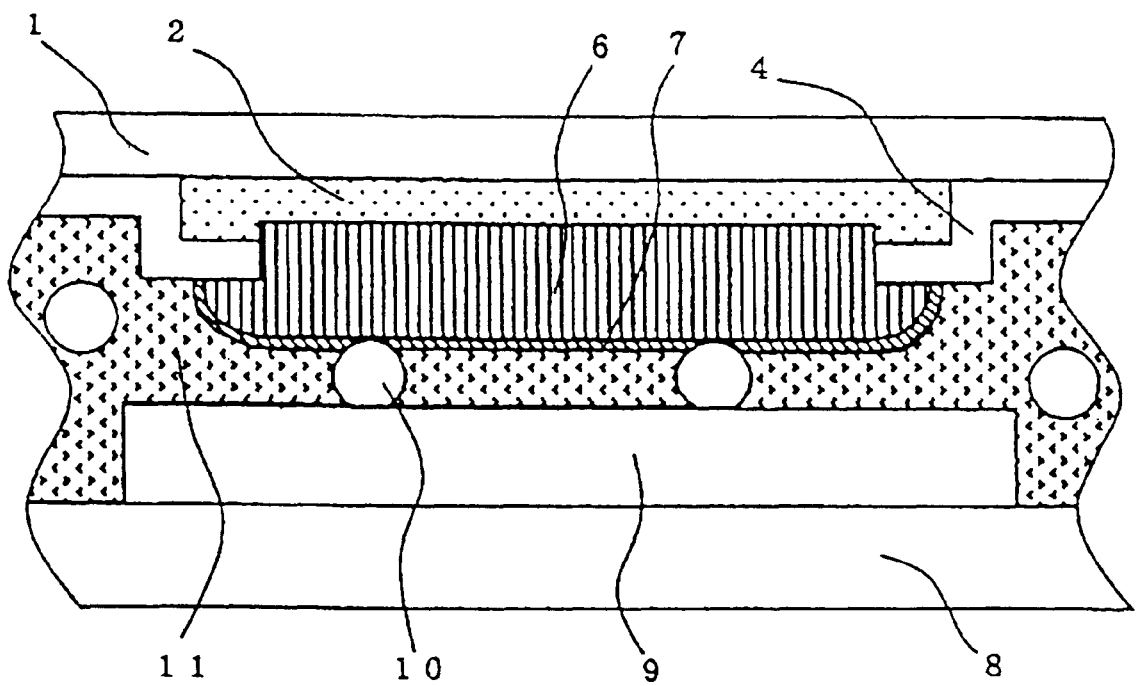

The semiconductor device can be mounted onto a conductor pattern wired on an insulating film with no device hole, a general printed circuit board or glass, a ceramic substrate, etc. As an example, the case where the semiconductor device is connected by the use of an anisotropic conductive film (ACF) as shown in FIG. 2(b) will be described. To a conductor pattern 9 at the side of an insulating film 8, an ACF 11 is temporarily compression-bonded, and the semiconductor device with the projected electrode is positionally aligned and then thermo-compression-bonded. The temperature at this time should desirably be 200° C., and the pressure about 1000 kg/cm². The projected electrode 6 and the conductor pattern 9 are connected to each other through conductive particles 10.

Figure 3A:
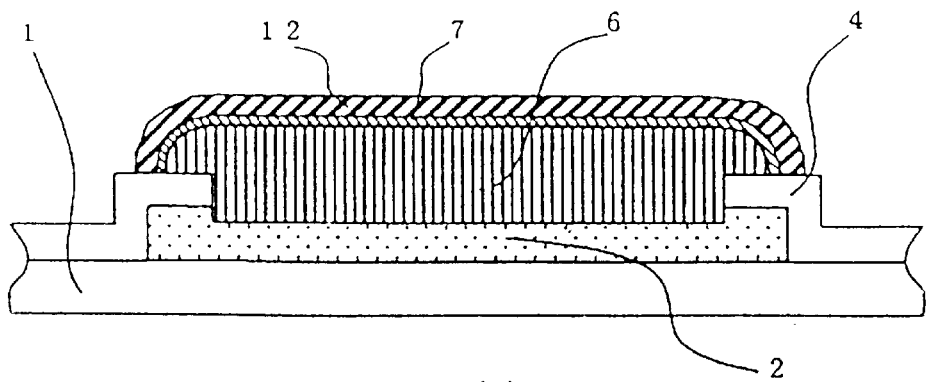
FIGS. 3(a) and 3(b) are schematic sectional views of a semiconductor device in a state where an Au layer is further formed on the Au film shown in FIG. 2(a) and in a state where the Au layer shown in FIG. 3(a) is connected to a conductor lead.

FIG. 3(a) is a diagram showing the state in which, on the Au film 7, an Au layer 12 is formed by electroless plating. In case of the electroless plating, the Au layer is grown by the reducing agent in the plating solution.

Figure 3B:
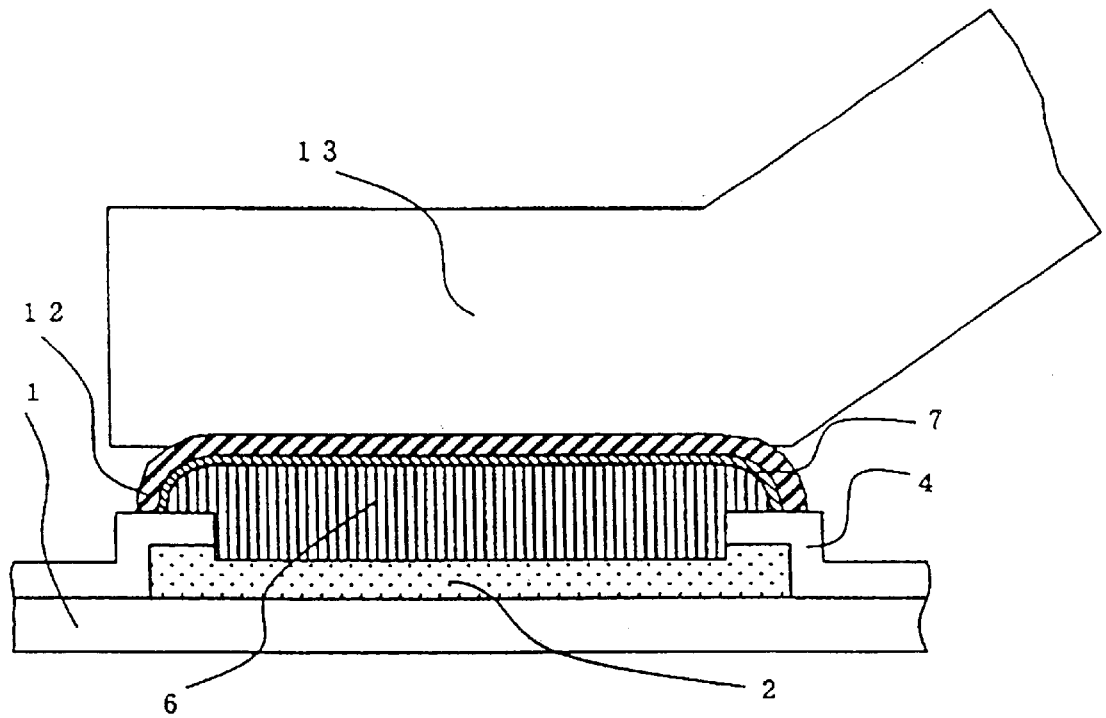
Figure 4A:
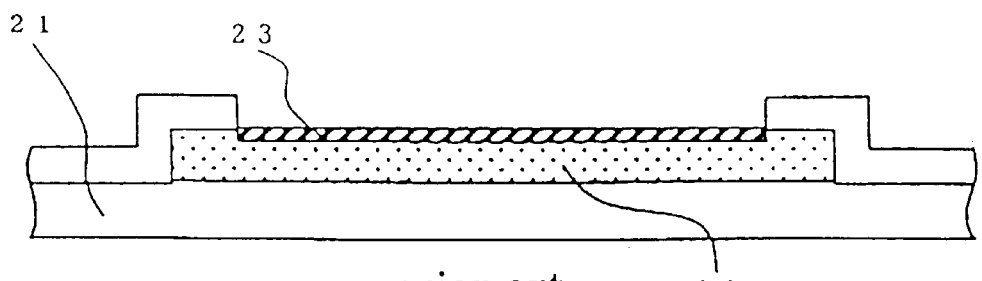
FIGS. 4(a) to 4(d) are schematic sectional views illustrating the step of forming a projected electrode in the conventional process of fabricating semiconductor devices.
Figure 4B:
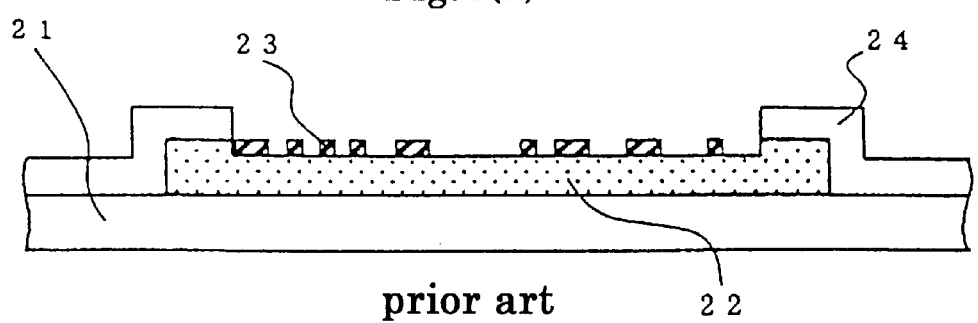
Figure 4C:
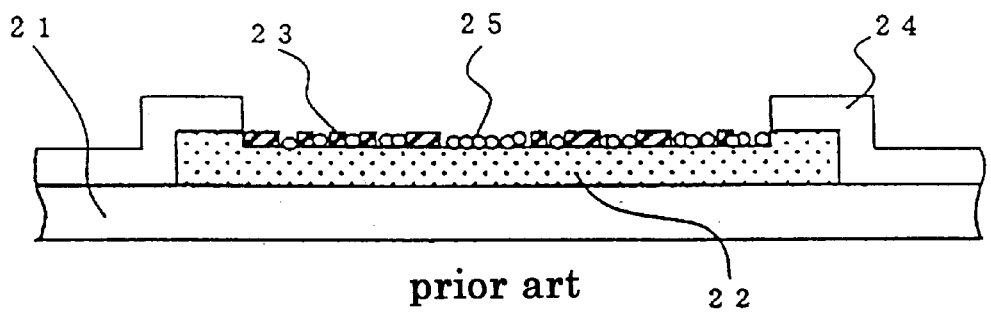
Figure 4D:
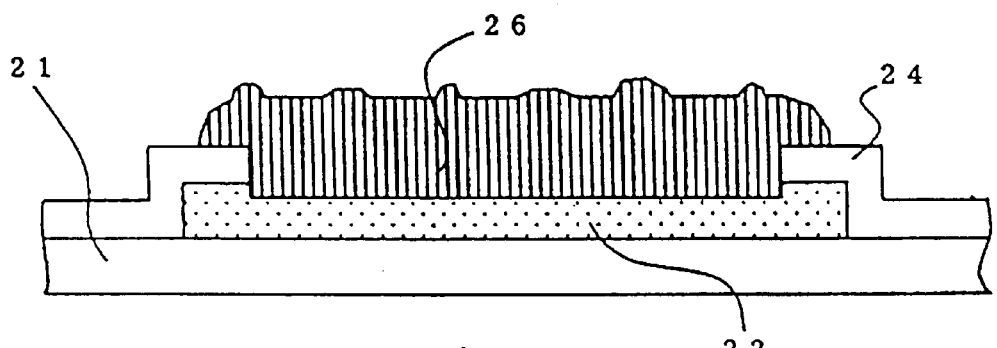

As an example of the mounting, there is the example according to which the semiconductor device is connected, on an insulating film having a device hole, to a conductor lead 13 projecting into the device hole and electrically connected from a wired conductor pattern (FIG. 3(b)). The conductor lead 13 projecting from the device hole is plated with Sn, and, on the projected electrode 6, an Au layer 12 is formed to a thickness of 1 μm or more by electroless plating. The Au layer 12 and the conductor lead are positionally aligned with each other and thermo-compression-bonded together at a time. In this case, the thermo-compression bonding should desirably be carried out at a temperature of about 500° C. and under a pressure of about 1200 kg/cm². In this connection, the thickness of the Sn-plating layer of the conductor lead should desirably be adjusted so that the ratio between the Au and Sn in the thermo-compression-bonded portion may become about 8 (Au):2 (Sn) in terms of weight ratio.

As mentioned above, according to the present invention, the etching of the surface oxide film on the Al electrode pad can be stably carried out, and thus, the film of the first metal can be stably formed with uniformity and denseness. As a result, the subsequent electroless plating can also be carried out stably, whereby the projected electrode comprising the film of the second metal can be formed with uniformity and denseness. As a result, the large-scale apparatus for carrying out the plating step in an inert atmosphere becomes disused. Further, the film of the second metal constituting the projected electrode can also be formed with uniformity and denseness and with a minute grain size; and thus, the surface of the film of the second metal can be formed in a smooth shape.

In case, even if the sample is left to stand in the air for about 10 days, after the surface oxide film 3 on the Al electrode pad 2 is removed by sputtering, the film of the first metal is formed with uniformity and denseness. Further, since the film of the first metal covers the Al electrode pad, it becomes possible to carry out an electroless plating in the air at the next step, using a desired metal.

Further, in case the Au film is formed, by flash plating, to a thickness of about 0.05 μm on the projected electrode, the reliability in the connection is affected by the surface state of the projected electrode. In case of the projected electrode formed according to the present invention, the Au film can be formed even and uniform. Further, in case the Au layer is formed on an Au film by electroless plating, the reliability in the connection is largely affected by the shape of the projected electrode and its surface state. In case of the projected electrode formed according to the present invention, the Au layer can be formed with a thickness of 1 μm or greater and with a dense surface state.

In case of connecting a conductor lead to the projected electrode with the Au layer, the conductor lead and the projected electrode are connected to each other by forming an eutectic alloy of the metals which constitute the conductor lead and the projected electrode, respectively. By using the projected electrode with an Au layer formed according to the present invention so as to have a dense surface state, it becomes possible to stably effect the formation of the eutectic alloy, and thus, connection with a high reliability can be realized.

For connecting the semiconductor device to a substrate or a conductor pattern formed on a carrier tape with no device hole, connection using an ACF is made possible. The conductive particles in the ACF are about 3 to 5 μm in size, so that, if the projected electrode surface is coarse, then the conductive particles get afloat to make the connection unstable, causing defects such as open-circuit. By using the projected electrode with an Au layer which is constituted according to the present invention so as to have a dense surface state, highly reliable connection becomes possible.

As mentioned above, by removing the surface oxide film on the Al electrode pad and forming the projected electrode by electroless plating in accordance with the present invention, it becomes possible to make the surface of the projected electrode dense and smooth in shape. Due to this, the surfaces of the Au film and the Au layer formed on the projected electrode can also be maintained in a dense and smooth shape. As a result, stable connection becomes possible, and highly reliable connection becomes possible.

Further, the projected electrode itself has a strength of bond since the substituting between Al and the first metal is effected with denseness and uniformity; and the projected electrode can also be made dense and fine in its grain size. Thus, it is possible to obtain a projected electrode which is highly resistant to the penetration of impurities from the outside and has a high reliability.

What is claimed is:

1. A process of fabricating a semiconductor device which has a wiring layer and active elements on a semiconductor substrate, the wiring layer and the active elements being protected by a protective film, and is provided with a projected electrode for connection with the outside in an opening portion of the protective film on an Al electrode pad electrically connected to the wiring layer, which comprises the steps of:

removing by sputtering a surface oxide film formed on a surface of the Al electrode pad;

depositing a film of a first metal on the Al electrode pad by substituting the first metal with Al constituting the Al electrode pad; and depositing a film of a second metal for constituting the projected electrode on the film of the first metal by substituting the first metal with the second metal, and forming the projected electrode by electroless plating by use of autocatalytic reaction.

2. The fabricating process according to claim 1, wherein the sputtering is carried out at an output of 500 W to 1000 W.

3. The fabricating process according to claim 1, wherein the sputtering is carried out in an atmosphere of an inert gas.

4. The fabricating process according to claim 1, wherein the film of the first metal is a film of Zn and the film of the second metal is a film of Ni or a Ni alloy.

5. The fabricating process according to claim 4, wherein the Zn film is formed by immersing the Al electrode pad in an alkaline solution containing Zn a plurality of times.

6. The fabricating process according to claim 4, wherein the Zn film has a thickness of 300 Å to 500 Å.

7. The fabricating process according to claim 1, wherein the projected electrode has a height of 0.5 $\mu$m to 50 $\mu$m.

8. The fabricating process according to claim 1, wherein the substituting of the first metal with Al constituting the Al electrode pad is effected in the air.

\* \* \* \* \*